US011196407B2

(12) United States Patent
Kawai et al.

(10) Patent No.: US 11,196,407 B2
(45) Date of Patent: Dec. 7, 2021

(54) RESONATOR AND RESONANT DEVICE

(71) Applicant: Murata Manufacturing Co., Ltd., Nagaokakyo (JP)

(72) Inventors: Ryota Kawai, Nagaokakyo (JP); Yoshihisa Inoue, Nagaokakyo (JP); Ville Kaajakari, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/690,550

(22) Filed: Nov. 21, 2019

(65) Prior Publication Data
US 2020/0144989 A1 May 7, 2020

Related U.S. Application Data

(63) Continuation of application No. PCT/JP2018/002628, filed on Jan. 29, 2018.
(Continued)

(51) Int. Cl.
*H03B 5/30* (2006.01)
*H03H 9/24* (2006.01)
(Continued)

(52) U.S. Cl.
CPC ............ *H03H 9/24* (2013.01); *G01C 19/56* (2013.01); *H01L 41/08* (2013.01); *H01L 41/18* (2013.01); *H01L 41/332* (2013.01); *H03H 9/21* (2013.01)

(58) Field of Classification Search
CPC .......... H03H 9/24; H03H 9/21; G01C 19/56; H01L 41/08; H01L 41/18; H01L 41/332
(Continued)

(56) References Cited

U.S. PATENT DOCUMENTS 6,911,765 B2 *  6/2005  Kawashima ....... H03H 9/02023
                                                310/370
7,253,554 B2 *  8/2007  Dalla Piazza ...... H03H 9/02133
                                                310/370
(Continued)

FOREIGN PATENT DOCUMENTS

JP    H08278142 A    10/1996
JP    2000249558 A    9/2000
(Continued)

OTHER PUBLICATIONS

International Search Report issued for PCT/JP2018/002628, dated Apr. 10, 2018.
(Continued)

*Primary Examiner* — Richard Tan
(74) *Attorney, Agent, or Firm* — Arent Fox LLP

(57) ABSTRACT

A resonator is provided that includes a vibrating portion including a three or more vibrating arms each having a fixed end and a free end, with at least two of the vibrating arms configured to bend out of plane in different phases, and a base having a front end connected to the fixed end of each vibrating arm and a rear end opposite from the front end. Moreover, a frame is disposed at least partially around the vibrating portion, a holding arm is provided between the vibrating portion and the holding portion and includes a first end connected to the base and a second end connected to the frame, and a plurality of holes disposed in the vibrating portion. Moreover, the plurality of holes are each formed in a region between any one pair of adjacent two of the plurality of vibrating arms in the base portion.

12 Claims, 7 Drawing Sheets

Related U.S. Application Data

(60) Provisional application No. 62/510,796, filed on May 25, 2017.

(51) Int. Cl.
*G01C 19/56* (2012.01)
*H01L 41/08* (2006.01)
*H01L 41/18* (2006.01)
*H01L 41/332* (2013.01)
*H03H 9/21* (2006.01)

(58) Field of Classification Search
USPC ........................................................ 331/154
See application file for complete search history.

(56) References Cited

U.S. PATENT DOCUMENTS

| | | | | |
|---|---|---|---|---|
| 8,056,414 B2 * | 11/2011 | Noguchi | ............ | G01C 19/5607 310/370 |
| 2010/0156246 A1 * | 6/2010 | Iwai | ............ | H03H 3/04 310/344 |
| 2011/0227450 A1 * | 9/2011 | Yamazaki | ............ | H03H 9/02125 310/318 |
| 2013/0076211 A1 * | 3/2013 | Arimatsu | ............ | H03H 9/0595 310/370 |
| 2015/0180449 A1 * | 6/2015 | Umeda | ............ | H03H 9/02448 310/370 |
| 2018/0034441 A1 | 2/2018 | Hirota et al. | | |

FOREIGN PATENT DOCUMENTS

| | | | | |
|---|---|---|---|---|
| JP | 2008113098 | * | 5/2008 | |
| JP | 2008113098 | A | 5/2008 | |
| JP | 2011234072 | A | 11/2011 | |
| WO | WO-2014002892 A1 | * | 1/2014 | ............ H03H 9/215 |
| WO | 2016175218 A1 | | 11/2016 | |

OTHER PUBLICATIONS

Written Opinion of the International Searching Authority issued for PCT/JP2018/002628, dated Apr. 10, 2018.

* cited by examiner

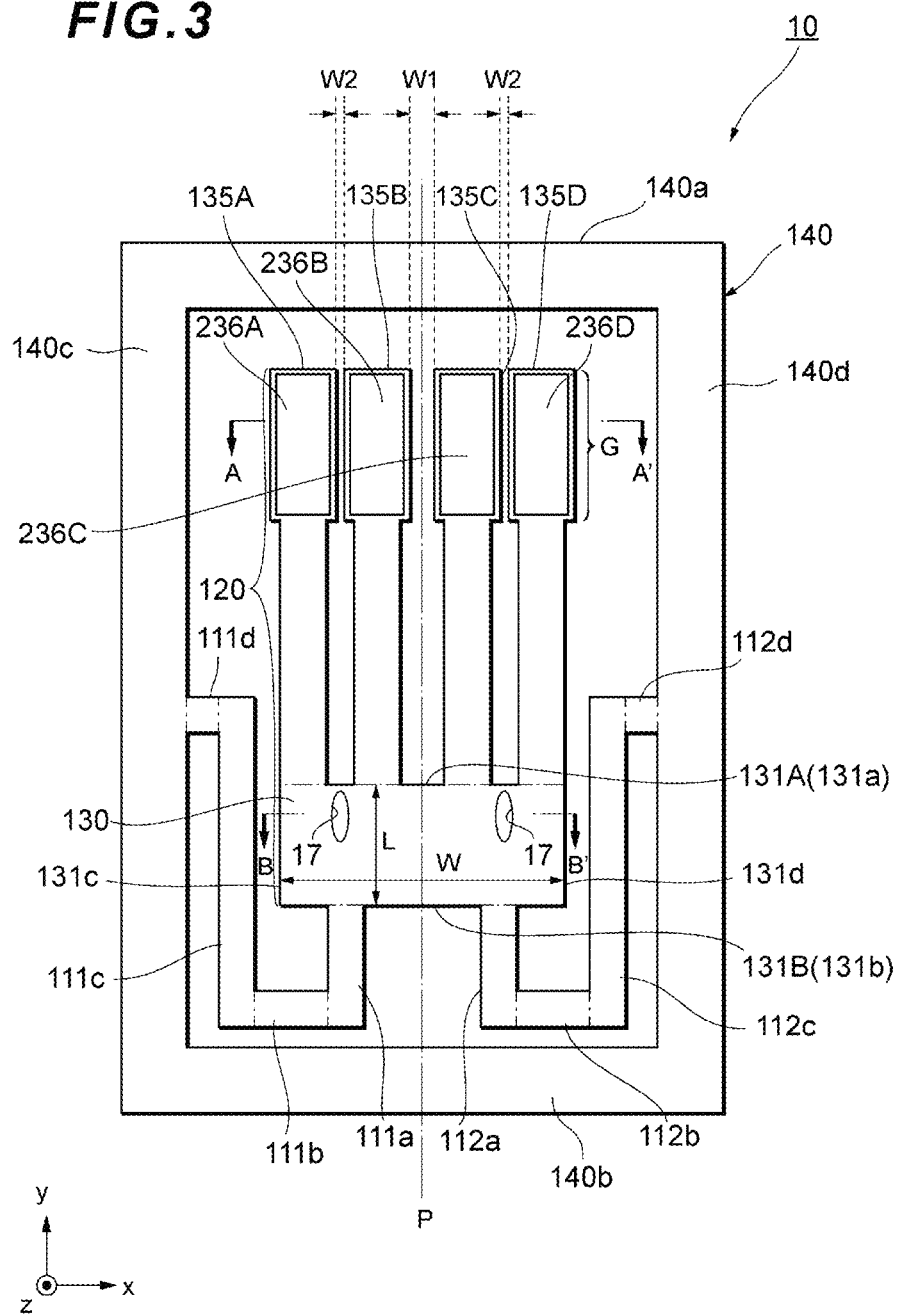

FIG.4B
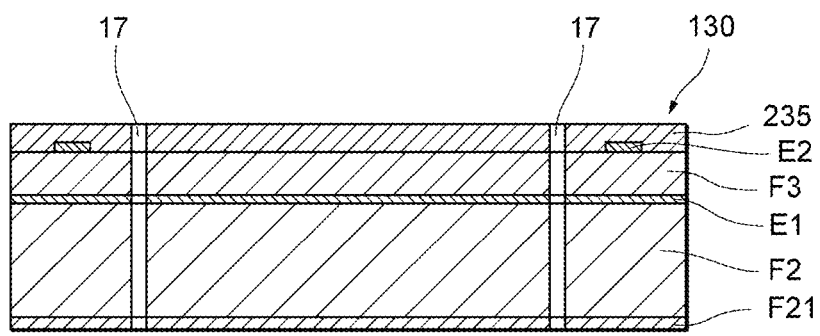
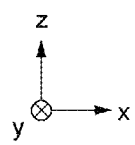

RESONATOR AND RESONANT DEVICE

CROSS REFERENCE TO RELATED APPLICATIONS

The present application is a continuation of PCT/JP2018/002628 filed Jan. 29, 2018, which claims priority to U.S. Provisional Patent Application No. 62/510,796, filed May 25, 2017, the entire contents of each of which are incorporated herein by reference.

TECHNICAL FIELD

The present invention relates to a resonator and a resonant device of which a plurality of vibrating arms vibrates in an out-of-plane bending vibration mode.

BACKGROUND

Currently, resonant devices that use a MEMS (micro electro mechanical systems) technology are used as, for example, a timing devices. Such a resonant device is implemented on a printed circuit board to be incorporated into an electronic device, such as a smartphone. The resonant device includes a lower substrate, an upper substrate that forms a cavity with the lower substrate, and a resonator disposed in the cavity between the lower substrate and the upper substrate.

For example, Patent Document 1 (identified below) describes a resonator including a plurality of vibrating arms. In the resonator, each vibrating arm is connected to a front end of a base portion at its fixed end, and the base portion is connected to a support portion at a rear end opposite from the front end. In the resonator described in Patent Document 1, the length (in a direction from the front end toward the rear end) of the base portion is set to less than the width of the base portion. For this reason, the resonator has such a structure that the base portion itself easily undergoes bending displacement. With this configuration, DLD (drive level dependency) is improved.

Patent Document 1: International Publication No. 2016/175218.

Form accuracy resulting from etching is substantially constant regardless of whether the base portion is long or short. For this reason, when the length of the base portion is reduced to improve DLD, the ratio of etching variations to the length of the base portion increases. This increases influence on DLD variations and thus there is room for further improvement.

SUMMARY OF THE INVENTION

The exemplary embodiments of the present invention are made in view of such a situation, and it is an object of the present invention to improve DLD while reducing variations in DLD in a resonator.

A resonator according to an exemplary aspect of the present invention includes a vibrating portion including a plurality of three or more vibrating arms each having a fixed end and a free end, at least two of the vibrating arms being configured to bend out of plane in different phases, and a base portion having a front end connected to the fixed end of each of the plurality of vibrating arms and a rear end opposite from the front end. Moreover, a holding portion is provided at least partially around the vibrating portion; a holding arm is provided between the vibrating portion and the holding portion, one end of the holding arm is connected to the base portion, an other end of the holding arm is connected to the holding portion; and a plurality of holes are formed in the vibrating portion. In an exemplary aspect, the plurality of holes each is formed in a region between any one pair of adjacent two of the plurality of vibrating arms in the base portion.

In an exemplary aspect, the plurality of holes is preferably formed in a region closer to the front end than to the rear end in the base portion.

In an exemplary aspect, the plurality of holes each is preferably formed in a region between the adjacent vibrating arms configured to vibrate in opposite phases from each other in the base portion.

In another exemplary aspect of the present invention, a resonator is provided that includes a vibrating portion including a plurality of three or more vibrating arms each having a fixed end and a free end, at least two of the vibrating arms being configured to bend out of plane in different phases, and a base portion having a front end connected to the fixed end of each of the plurality of vibrating arms and a rear end opposite from the front end. Moreover, a holding portion is provided at least partially around the vibrating portion; a holding arm is provided between the vibrating portion and the holding portion, one end of the holding arm is connected to the base portion, an other end of the holding arm is connected to the holding portion; and a plurality of holes are formed in the vibrating portion. In an exemplary aspect, the plurality of holes each is formed in a region closer to the fixed end than to the free end in any one of the plurality of vibrating arms.

In an exemplary aspect, the plurality of holes each is preferably formed near a center of the any one of the vibrating arms in a direction in which the plurality of vibrating arms is arranged.

In an exemplary aspect, the plurality of holes each preferably has a shape having a longitudinal diameter along a direction in which each of the plurality of vibrating arms extends.

Moreover, in an exemplary aspect, the resonators described above are configured such that the plurality of holes are formed at symmetrical positions with respect to a central axis passing through a center of the vibrating portion in a direction in which the plurality of vibrating arms is arranged.

In an exemplary aspect, each of the plurality of holes is preferably a through-hole.

In another exemplary aspect, each of the plurality of holes is preferably a recess.

In yet another exemplary aspect, a resonant device is provided that includes the above-described resonator; a top lid and a bottom lid provided to face each other with the resonator interposed between the top lid and the bottom lid; and an outer electrode.

According to the exemplary embodiments of the present invention, in a resonator, DLD can be improved while variations in DLD are reduced.

BRIEF DESCRIPTION OF DRAWINGS

FIG. 3 is a plan view of a resonator according to the first exemplary embodiment of the present invention in a state where an upper substrate is removed.

FIG. 4B is a cross-sectional view taken along the line B-B' in FIG. 3.

DETAILED DESCRIPTION OF EXEMPLARY EMBODIMENTS

First Exemplary Embodiment

Figure 1:
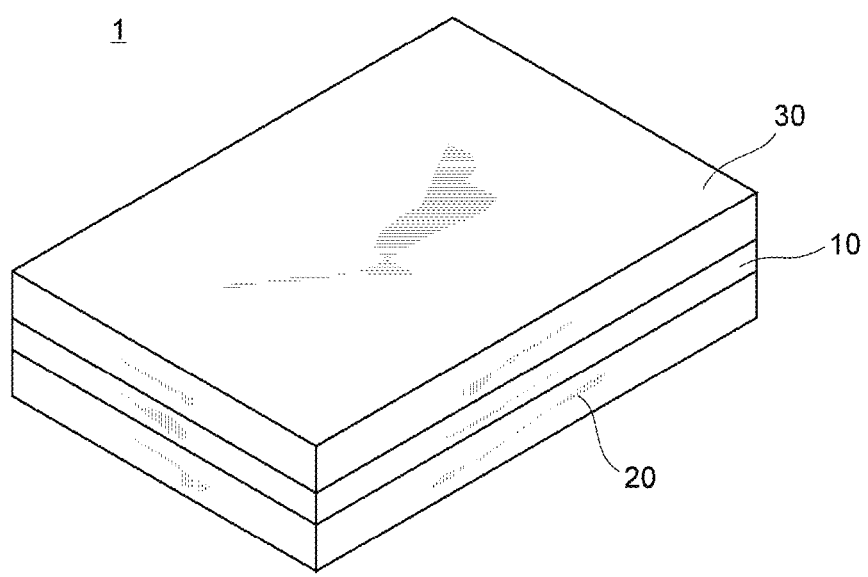
FIG. 1 is a perspective view that schematically shows the appearance of a resonant device according to a first exemplary embodiment of the present invention.
Figure 2:
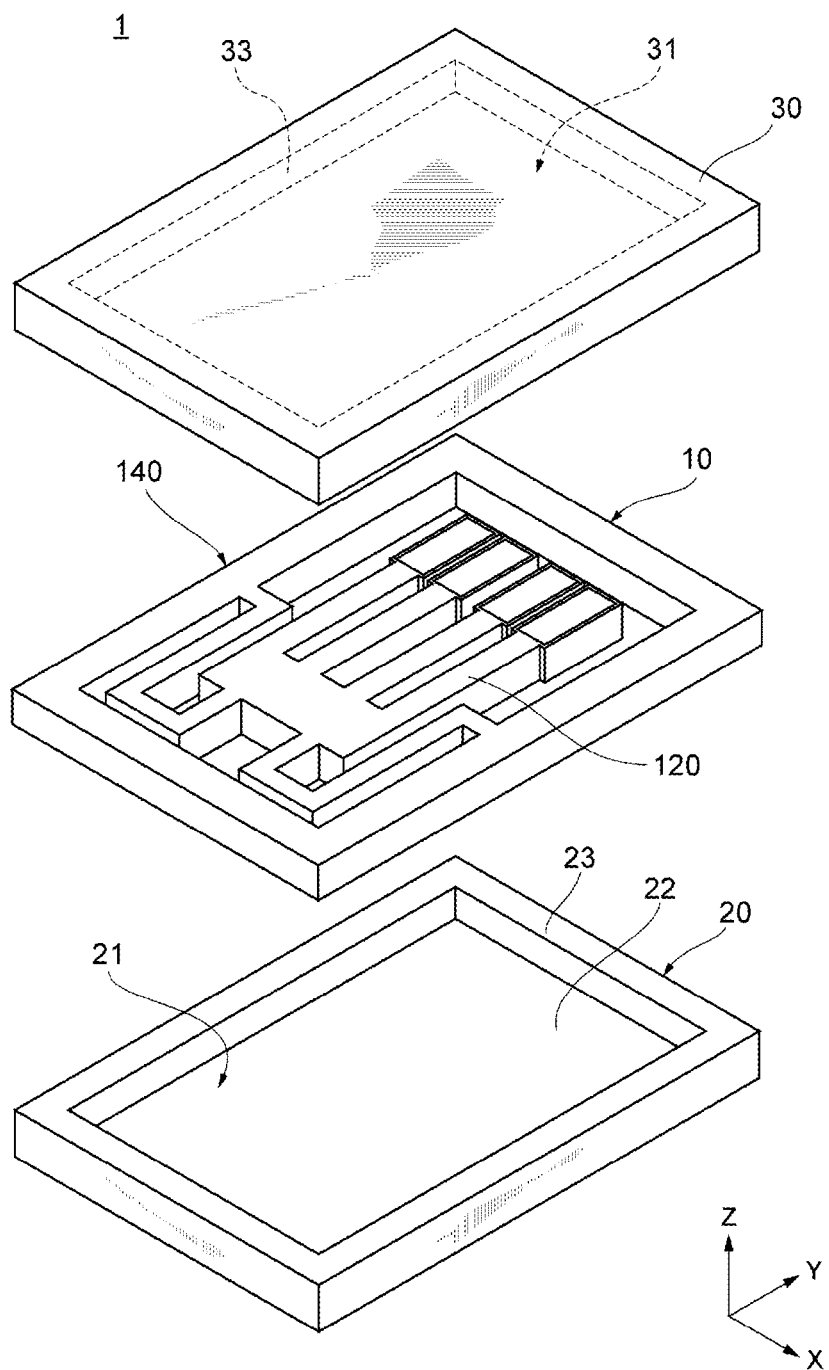
FIG. 2 is an exploded perspective view that schematically shows the structure of the resonant device according to the first exemplary embodiment of the present invention.

Hereinafter, a first exemplary embodiment of the present invention will be described with reference to the attached drawings. FIG. 1 is a perspective view that schematically shows the appearance of a resonant device 1 according to the first embodiment. FIG. 2 is an exploded perspective view that schematically shows the structure of the resonant device 1 according to the first embodiment.

As shown, the resonant device 1 includes a resonator 10, and a top lid 30 and a bottom lid 20 provided to face each other with the resonator 10 interposed therebetween. In other words, the resonant device 1 is made up of the bottom lid 20, the resonator 10, and the top lid 30, stacked in this order.

Moreover, the resonator 10 is bonded to the bottom lid 20 and the top lid 30. Thus, the resonator 10 is encapsulated, and a vibrating space for the resonator 10 is formed. In an exemplary aspect, the resonator 10, the bottom lid 20, and the top lid 30 each are made from an Si substrate. The resonator 10, the bottom lid 20, and the top lid 30 are bonded to each other by bonding the Si substrates to each other. Moreover, the resonator 10 and the bottom lid 20 may be made from an SOI substrate.

In an exemplary aspect, the resonator 10 is a MEMS resonator manufactured by using the MEMS technology. In the present embodiment, description will be made on the assumption that the resonator 10 is made from, for example, a silicon substrate. Hereinafter, the components of the resonant device 1 will be described in detail.

(1. Top Lid 30)

The top lid 30 expands in a planar shape along an XY-plane and has, for example, a flat rectangular parallelepiped recess 31 at its back surface. The recess 31 is surrounded by a side wall 33 and forms part of the vibrating space that is the space in which the resonator 10 vibrates.

(2. Bottom Lid 20)

Moreover, the bottom lid 20 has a rectangular planar bottom plate 22 provided along the XY-plane and a side wall 23 extending in a Z-axis direction (that is, a direction in which the bottom lid 20 and the resonator 10 are stacked) from a peripheral portion of the bottom plate 22. The bottom lid 20 has a recess 21 at a surface facing the resonator 10. The recess 21 is formed by a surface of the bottom plate 22 and an inner surface of the side wall 23. The recess 21 is part of the vibrating space for the resonator 10. The vibrating space is hermetically sealed by the above-described top lid 30 and bottom lid 20 and is maintained in a vacuum state. The vibrating space may be filled with gas, such as inert gas.

(3. Resonator 10)

FIG. 3 is a plan view that schematically shows the structure of the resonator 10 according to the present embodiment. The components of the resonator 10 according to the present embodiment will be described with reference to FIG. 3. The resonator 10 includes a vibrating portion 120 (or vibrator), a holding portion 140 (or frame), and holding arms 111, 112.

(a) Vibrating Portion 120

The vibrating portion 120 has a rectangular outline and expands along the XY-plane in the Cartesian coordinate system of FIG. 3. The vibrating portion 120 is provided on the inner side of the holding portion 140. A space is formed with a predetermined clearance between the vibrating portion 120 and the holding portion 140. In the example of FIG. 3, the vibrating portion 120 includes a base portion 130, four vibrating arms 135A to 135D (also collectively referred to as vibrating arms 135), and holes 17. It should be appreciated that the number of the vibrating arms is not limited to four and is set to a selected number greater than or equal to, for example, three. In the present embodiment, each vibrating arm 135 and the base portion 130 are integrally formed.

Base Portion 130

The base portion 130 (or base) has long sides 131a, 131b in an X-axis direction and short sides 131c, 131d in a Y-axis direction in plan view. The long side 131a is one of the sides of a surface 131A (hereinafter, also referred to as front end 131A) at a front end of the base portion 130. The long side 131b is one of the sides of a surface 131B (hereinafter, also referred to as rear end 131B) at a rear end of the base portion 130. In the base portion 130, the front end 131A and the rear end 131B are provided to face each other.

The base portion 130 is connected to the vibrating arms 135 (described later) at the front end 131A and connected to the holding arms 111, 112 (described later) at the rear end 131B. The base portion 130 has a substantially rectangular shape in plan view in the example of FIG. 3; however, it is noted that the base portion 130 is not limited thereto. The base portion 130 just needs to be formed substantially symmetrically with respect to an imaginary plane P that is defined along the perpendicular bisector of the long side 131a. The base portion 130 may have, for example, a trapezoidal shape in which the long side 131b is shorter than the long side 131a or a half-round shape having the long side 131a as a diameter. Each surface of the base portion 130 is not limited to a plane and may be a curved surface. The imaginary plane P is a plane including a central axis passing through the center of the vibrating portion 120 in a direction in which the vibrating arms 135 are arranged.

In the base portion 130, a base portion length L (in FIG. 3, the length of each of the short sides 131c, 131d) that is the longest distance between the front end 131A and the rear end 131B in a direction from the front end 131A toward the rear end 131B is approximately 45 µm. A base portion width W (in FIG. 3, the length of each of the long sides 131a, 131b) that is the longest distance between the side ends of the base portion 130 in a width direction perpendicular to the direction of the base portion length is approximately 280 µm.

Vibrating Arms 135

The vibrating arms 135 extend in the Y-axis direction and each have the same size. The vibrating arms 135 each are provided parallel to the Y-axis direction and to each other between the base portion 130 and the holding portion 140. One end of each vibrating arm 135 is connected to the front end 131A of the base portion 130 to serve as a fixed end, and the other end of each vibrating arm 135 serves as a free end. The vibrating arms 135 are arranged in the X-axis direction at predetermined intervals. The vibrating arms 135 each have, for example, approximately 50 µm in width in the X-axis direction and approximately 465 µm in length in the Y-axis direction.

In an exemplary aspect, the vibrating arms 135 each have a weight portion G at the free end. The weight portion G is wider in width in the X-axis direction than the other portion of the vibrating arm 135. The weight portion G is, for example, approximately 70 μm in width in the X-axis direction. The weight portion G is integrally formed through the same process with the vibrating arm 135. With the weight portion G, the weight of the vibrating arm 135 per unit length on the free end side is greater than that on the fixed end side. Therefore, since the vibrating arms 135 each have the weight portion G at the free end side, the amplitude of vibrations in an up-down direction in each vibrating arm can be increased.

In the vibrating portion 120 of the present embodiment, in the X-axis direction, the two vibrating arms 135A, 135D are disposed on the outer side, and the two vibrating arms 135B, 135C are disposed on the inner side. In an exemplary aspect, a clearance W1 between the vibrating arms 135B, 135C in the X-axis direction is set to greater than a clearance W2 between the outer vibrating arm 135A (135D) and the inner vibrating arm 135B (135C) adjacent to the outer vibrating arm 135A (135D) in the X-axis direction. The clearance W1 is, for example, approximately 10μ. The clearance W2 is, for example, approximately 5 μm. When the clearance W2 is set to less than the clearance W1, vibration characteristics are improved. However, when the resonant device 1 is miniaturized, the clearance W1 may be set to less than the clearance W2 or may be equal to the clearance W2.

In the present embodiment, one or more holes 17 are formed or otherwise disposed in each of a region between the outer vibrating arm 135A and the inner vibrating arm vibrating arm 135B and a region between the outer vibrating arm 135D and the inner vibrating arm vibrating arm 135C in the base portion 130 (that is, between extended lines of the vibrating arms). In the present embodiment, each hole 17 is a through-hole having a circular arc-shaped opening whose width along the X-axis direction is approximately 5 μm and whose length along the Y-axis direction is approximately 18 m. Each hole 17 is formed to have a longitudinal diameter in a direction in which the vibrating arms 135 extend (in the direction from the front end 131A toward the rear end 131B) in a front end 131A-side region of the base portion 130. As is apparent from FIG. 3, each hole 17 is formed in the base portion 130 in a thickness direction (a vibrating direction of the vibrating arms 135).

It is noted that the shape or position of each hole 17 is not limited to the example of FIG. 3. For example, the shape of each hole 17 may be polygonal, circular, or elliptical. In addition, each hole 17 is not limited to a through-hole and may be a dent (recess). However, when each hole 17 is formed in a polygonal shape, it is preferable from the viewpoint of, for example, the strength of the base portion 130 that the edge of the opening is chamfered.

Moreover, it is noted that the positions at which the holes 17 are formed should be substantially symmetrical positions with respect to the imaginary plane P. Each hole 17 may be formed between any adjacent vibrating arms 135 or each hole 17 may be formed between some adjacent vibrating arms 135. For example, when it is assumed that the number of vibrating arms is six or more, it is conceivable that (1) the hole 17 is formed one by one (two in total) in a region between the outermost vibrating arm and the second vibrating arm from the outer side, (2) the hole 17 is formed one by one (two in total) in a region between the second and third vibrating arms from the outer side, (3) the hole 17 is formed one by one (four in total) between the outermost vibrating arm and the second vibrating arm from the outer side and between the second and third vibrating arms from the outer side, or (4) the hole 17 is formed one by one (five in total) between any adjacent vibrating arms. It is noted this configuration is provided for exemplary purposes.

When each hole 17 is a dent, the hole 17 may be formed over a range from a front end 131A-side region to a rear end 131B-side region.

It is also noted that the number of the holes 17 formed in a region between the vibrating arms 135 is not limited to one and may be multiple. In this case, preferably, each hole 17 has a longitudinal diameter in a direction along the front end 131A, and the plurality of holes 17 is aligned at equal intervals in the direction from the front end 131A toward the rear end 131B.

In another exemplary aspect, a protective film 235 is formed or otherwise provided on the surface (surface facing the top lid 30) of the vibrating portion 120 so as to cover the entire surface. In addition, frequency adjusting films 236A to 236D (hereinafter, the frequency adjusting films 236A to 236D are also collectively referred to as frequency adjusting films 236) are respectively formed partially on the surface of the protective film 235 in the vibrating arms 135A to 135D. The resonant frequency of the vibrating portion 120 can be adjusted with the protective film 235 and the frequency adjusting films 236. Although the protective film 235 does not necessarily cover the entire surface of the vibrating portion 120, it is desirable that the entire surface of the vibrating portion 120 be covered in terms of protecting a base electrode film (for example, a metal layer E2 in FIG. 4) and a base piezoelectric film (for example, a piezoelectric thin film F3 in FIG. 4) in frequency adjustment from damage.

The frequency adjusting films 236 each are formed on the protective film 235 in at least part of a region whose displacement caused by vibrations is greater than other regions in the vibrating portion 120 such that the surface is exposed. Specifically, each frequency adjusting film 236 is formed at the distal end of an associated one of the vibrating arms 135, that is, the weight portion G. On the other hand, the surface of the protective film 235 is exposed in the other region in the vibrating arms 135. In this embodiment, each frequency adjusting film 236 is formed up to the distal end of the vibrating arm 135, and the protective film 235 is not exposed at all at the distal end portion. However, the frequency adjusting film 236 may be not formed at the distal end portion of the vibrating arm 135 such that part of the protective film 235 is exposed.

(b) Holding Portion 140

The holding portion 140 (otherwise referred to as a frame) is formed in a rectangular frame shape along the XY-plane. The holding portion 140 is provided so as to surround the vibrating portion 120 along the XY-plane in plan view. The holding portion 140 should be provided at least partially around the vibrating portion 120 and is not limited to an entire frame shape. For example, the holding portion 140 just needs to be provided around the vibrating portion 120 to such an extent that the holding portion 140 holds the vibrating portion 120 and can be bonded to the top lid 30 and the bottom lid 20.

In the present embodiment, the holding portion 140 is formed of integrally formed square columnar frame elements 140a to 140d. As shown in FIG. 3, the frame element 140a faces the free ends of the vibrating arms 135, and the longitudinal direction of the frame element 140a is provided parallel to the X-axis. The frame element 140b faces the rear end 131B of the base portion 130, and the longitudinal direction of the frame element 140b is provided parallel to the X-axis. The frame element 140c faces the side end (i.e., short side 131c) of the base portion 130 and the vibrating arm 135A, the longitudinal direction of the frame element 140c is provided parallel to the Y-axis, and both ends of the frame element 140c are respectively connected to one ends of the frame elements 140a, 140b. The frame element 140d faces the side end (i.e., short side 131d) of the base portion 130 and the vibrating arm 135D, the longitudinal direction of the frame element 140d is provided parallel to the Y-axis, and both ends of the frame element 140d are respectively connected to the other ends of the frame elements 140a, 140b.

In the present embodiment, description will be made on the assumption that the holding portion 140 is covered with the protective film 235; however, the configuration is not limited thereto. For example, it is noted that the protective film 235 need not be formed on the surface of the holding portion 140.

(c) Holding Arms 111, 112

In an exemplary aspect, the holding arm 111 and the holding arm 112 are provided on the inner side of the holding portion 140, and connect the rear end 131B of the base portion 130 to the frame elements 140c, 140d. As shown in FIG. 3, the holding arm 111 and the holding arm 112 are formed substantially symmetrically with respect to the imaginary plane P defined parallel to the YZ-plane along a center line of the base portion 130 in the X-axis direction.

Moreover, the holding arm 111 has arms 111a, 111b, 111c, 111d. One end of the holding arm 111 is connected to the rear end 131B of the base portion 130, and the holding arm 111 extends from there toward the frame element 140b. The holding arm 111 bends in a direction toward the frame element 140c (that is, the X-axis direction), further bends in a direction toward the frame element 140a (that is, the Y-axis direction), bends in a direction toward the frame element 140c (that is, the X-axis direction) again, and then the other end is connected to the frame element 140c.

As further shown, the arm 111a is provided between the base portion 130 and the frame element 140b such that the arm 111a faces the frame element 140c and the longitudinal direction of the arm 111a is parallel to the Y-axis. One end of the arm 111a is connected to the base portion 130 at the rear end 131B, and the arm 111a extends from there substantially perpendicularly to the rear end 131B, that is, the arm 111a extends in the Y-axis direction. It is desirable that an axis passing through the center of the arm 111a in the X-axis direction be provided on the inner side with respect to the center line of the vibrating arm 135A. In the example of FIG. 3, the arm 111a is provided between the vibrating arm 135A and the vibrating arm 135B. The other end of the arm 111a is connected to one end of the arm 111b at its side surface. The arm 111a is approximately 20 μm in width defined in the X-axis direction and 40 μm in length defined in the Y-axis direction.

The arm 111b is provided between the base portion 130 and the frame element 140b such that the arm 111b faces the frame element 140b and the longitudinal direction of the arm 111b is parallel to the X-axis direction. One end of the arm 111b is connected to the other end of the arm 111a, that is, the side surface facing the frame element 140c, and the arm 111b extends from there substantially perpendicularly to the arm 111a, that is, the arm 111b extends in the X-axis direction. The other end of the arm 111b is connected to one end of the arm 111c, that is, a side surface facing the vibrating portion 120. The arm 111b is, for example, approximately 20 μm in width defined in the Y-axis direction and approximately 75 μm in length defined in the X-axis direction.

As yet further shown, the arm 111c is provided between the base portion 130 and the frame element 140c such that the arm 111c faces the frame element 140c and the longitudinal direction of the arm 111c is parallel to the Y-axis direction. One end of the arm 111c is connected to the other end of the arm 111b at its side surface, and the other end of the arm 111c is connected to one end of the arm 111d, that is, a side surface on a frame element 140c side. The arm 111c is, for example, approximately 20 μm in width defined in the X-axis direction and approximately 140 μm in length defined in the Y-axis direction.

The arm 111d is provided between the base portion 130 and the frame element 140c such that the arm 111d faces the frame element 140a and the longitudinal direction of the arm 111d is parallel to the X-axis direction. One end of the arm 111d is connected to the other end of the arm 111c, that is, the side surface facing the frame element 140c. The other end of the arm 111d is connected to the frame element 140c at a position facing near a connection portion of the vibrating arm 135A with the base portion 130, and the arm 111d extends from there substantially perpendicularly to the frame element 140c, that is, the arm 111d extends in the X-axis direction. The arm 111d is, for example, approximately 20 μm in width defined in the Y-axis direction and approximately 10 μm in length defined in the X-axis direction.

In this way, the holding arm 111 is connected to the base portion 130 at the arm 111a, bends at the connection portion between the arm 111a and the arm 111b, the connection portion between the arms 111b, 111c, and the connection portion between the arms 111c, 111d, and is then connected to the holding portion 140.

The holding arm 112 has arms 112a, 112b, 112c, 112d and in general a similar configuration as holding arm 111. Thus, as shown, one end of the holding arm 112 is connected to the rear end 131B of the base portion 130, and the holding arm 112 extends from there toward the frame element 140b. The holding arm 112 bends in a direction toward the frame element 140d (that is, the X-axis direction), further bends in a direction toward the frame element 140a (that is, the Y-axis direction), bends in a direction toward the frame element 140d (that is, the X-axis direction) again, and then the other end is connected to the frame element 140d. The configurations of the arms 112a, 112b, 112c, 112d are respectively symmetrical to the configurations of the arms 111a, 111b, 111c, 111d, so the detailed description is omitted.

The holding arms 111, 112 are not limited to a shape bent at right angles at the connection portions of each arm and may have a curved shape. The number of times the holding arms 111, 112 bend is not limited to the above-described times. For example, the holding arms 111, 112 bend once and connect with the rear end 131B of the base portion 130 and the associated frame elements 140c, 140d, bend twice and connect with the rear end 131B of the base portion 130 and the frame element 140a, or connect with the rear end 131B of the base portion 130 and the frame element 140b without bending once. The connection portion, to which the holding arms 111, 112 are connected, in the base portion 130 is not limited to the rear end 131B. The holding arms 111, 112 may be respectively connected to side surfaces connecting the front end 131A and the rear end 131B.

(4. Multilayer Structure)

Figure 4A:
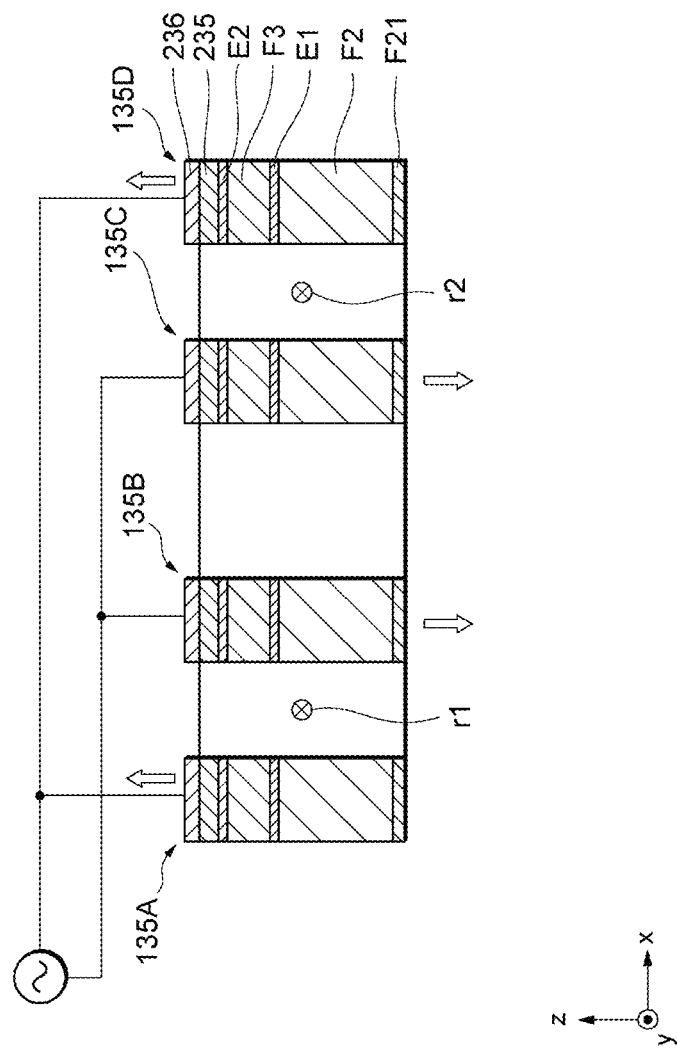
FIG. 4A is a cross-sectional view taken along the line A-A' in FIG. 3.

A multilayer structure of the resonator 10 will be described with reference to FIG. 4A and FIG. 4B. FIG. 4A is a schematic view that shows the cross-sectional view taken along the line A-A' in FIG. 3 and that schematically shows the electrical connection mode of the resonator 10. FIG. 4B is a schematic view that shows the cross-sectional view taken along the line B-B' in FIG. 3.

In the resonator 10, the holding portion 140, the base portion 130, the vibrating arms 135, and the holding arms 111, 112 are integrally formed in the same process. In the resonator 10, first, a metal layer E1 is laminated on an Si (i.e., silicon) substrate F2. The piezoelectric thin film F3 is laminated on the metal layer E1 so as to cover the metal layer E1. The metal layer E2 is further laminated on the surface of the piezoelectric thin film F3. The protective film 235 is laminated on the metal layer E2 so as to cover the metal layer E2. In the vibrating portion 120, the frequency adjusting films 236 are further laminated on the protective film 235. When a degenerate silicon substrate having a low resistance is used, the Si substrate F2 also serves as the metal layer E1, so the metal layer E1 can be omitted.

The Si substrate F2 is made from, for example, a degenerate n-type Si semiconductor having a thickness of approximately 6 µm, and may contain P (i.e., phosphorus), As (i.e., arsenic), Sb (i.e., antimony), or the like, as an n-type dopant. The resistance value of the degenerate Si that is used for the Si substrate F2 is, for example, lower than 1.6 mΩ·cm and, more preferably, lower than or equal to 1.2 mΩ·cm. A silicon oxide (for example, $SiO_2$) layer (temperature characteristics correction layer) F21 is formed on the bottom surface of the Si substrate F2. Thus, temperature characteristics can be improved.

In the present embodiment, the silicon oxide layer (i.e., referred to as temperature characteristics correction layer) F21 is a layer having a function of reducing the temperature coefficient (that is, the rate of change per temperature) of frequency at least near room temperature in the vibrating portion when the temperature correction layer is formed on the Si substrate F2 as compared to when the silicon oxide layer F21 is not formed on the Si substrate F2. When the vibrating portion 120 has the silicon oxide layer F21, for example, a change, with temperature, in the resonant frequency of a multilayer structure made up of the Si substrate F2, the metal layers E1, E2, the piezoelectric thin film F3, and the silicon oxide layer (i.e., referred to as temperature correction layer) F21 is reduced.

In the resonator 10, the silicon oxide layer F21 is desirably formed with a uniform thickness. It is noted that for purposes of this disclosure, a uniform thickness means that variations in the thickness of the silicon oxide layer F21 fall within ±20% from an average value of the thickness.

The silicon oxide layer F21 may be formed on the top surface of the Si substrate F2 or may be formed on both the top surface and bottom surface of the Si substrate F2. In the holding portion 140, the silicon oxide layer F21 need not be formed on the bottom surface of the Si substrate F2.

The metal layers E2, E1 are formed from Mo (i.e., molybdenum), Al (i.e., aluminum), or another material, having a thickness of, for example, approximately 0.1 µm to approximately 0.2 µm. The metal layers E2, E1 are formed in a desired shape by etching, or another method. The metal layer E1 is formed to function as a lower electrode in, for example, the vibrating portion 120. In the holding arms 111, 112 or the holding portion 140, the metal layer E1 is formed to function as a wire for connecting the lower electrode to an alternating-current power supply provided outside the resonator 10.

On the other hand, the metal layer E2 is formed to function as an upper electrode in the vibrating portion 120.

In the holding arms 111, 112 or the holding portion 140, the metal layer E2 is formed to function as a wire for connecting the upper electrode to a circuit provided outside the resonator 10.

In connecting the alternating-current power supply to the lower wire or the upper wire, an electrode (i.e., an example of an outer electrode) may be formed on the outer surface of the top lid 30 to connect the circuit to the lower wire or the upper wire or a via may be formed in the top lid 30 and a wire may be formed by filling an electrically conductive material inside the via to connect the alternating-current power supply to the lower wire or the upper wire.

The piezoelectric thin film F3 is a thin film of a piezoelectric body that converts an applied voltage to vibrations may contain, for example, a nitride, such as AlN (i.e., aluminum nitride), or an oxide as a main ingredient. Specifically, the piezoelectric thin film F3 may be made of ScAlN (i.e., scandium aluminum nitride). ScAlN is a substance in which part of aluminum in aluminum nitride is replaced with scandium. The piezoelectric thin film F3 has a thickness of, for example, 1 µm and may have a thickness of approximately 0.2 µm to approximately 2 µm.

According to the exemplary aspect, the piezoelectric thin film F3 is configured to extend or contract in an in-plane direction of the XY-plane, that is, Y-axis direction, in response to an electric field that is applied to the piezoelectric thin film F3 by the metal layers E2, E1. With this extension or contraction of the piezoelectric thin film F3, the vibrating arms 135 displace their free ends toward the inner surfaces of the bottom lid 20 and top lid 30 and vibrate in an out-of-plane bending vibration mode.

The protective film 235 is a layer of an electrically insulating body and is made of a material of which the rate of reduction in mass resulting from etching is lower than that of the frequency adjusting films 236. For example, the protective film 235 is made from a nitride film of AlN, SiN, or the like, or an oxide film of $Ta_2O_5$ (i.e., tantalum pentoxide), SiO2, or the like. The rate of reduction in mass is expressed by the product of an etching rate (i.e., thickness that is removed per unit time) and a density. The thickness of the protective film 235 is less than or equal to half of the thickness of the piezoelectric thin film F3 and is, for example, approximately 0.2 µm in the present embodiment.

The frequency adjusting films 236 each are a layer of an electrically conductive body and made of a material of which the rate of reduction in mass resulting from etching is higher than that of the protective film 235. The frequency adjusting films 236 each are made of a metal, such as molybdenum (Mo), tungsten (W), gold (Au), platinum (Pt), nickel (Ni), aluminum (Al), and titanium (Ti).

As long as the relationship in the rate of reduction in mass between the protective film 235 and each frequency adjusting film 236 is as described above, the magnitude relation in etching rate is freely selected.

In an exemplary aspect, the frequency adjusting films 236 are formed by once forming a film over substantially the entire surface of the vibrating portion 120 and then forming the film into only predetermined regions by applying treatment, such as etching.

Moreover, etching on the protective film 235 and the frequency adjusting films 236 is performed by, for example, irradiating ion beam (for example, argon (Ar) ion beam) to the protective film 235 and the frequency adjusting films 236 at the same time. Ion beam can be irradiated to a range wider than the resonator 10. An etching method is not limited to the one using ion beam.

(5. Function of Resonator)

The function of the resonator 10 will be described with reference to FIG. 4A. In the present embodiment, the phase of electric field that is applied to the outer vibrating arms 135A, 135D and the phase of electric field that is applied to the inner vibrating arms 135B, 135C are set to opposite phases from each other. Thus, the outer vibrating arms 135A, 135D and the inner vibrating arms 135B, 135C are configured to be displaced in opposite directions from each other. For example, when the outer vibrating arms 135A, 135D displace their free ends toward the inner surface of the top lid 30, the inner vibrating arms 135B, 135C displace their free ends toward the inner surface of the bottom lid 20.

Thus, in the resonator 10 according to the present embodiment, during vibrations in opposite phases, the vibrating arm 135A and the vibrating arm 135B vibrate in opposite directions in the up-down direction around a central axis r1 extending parallel to the Y-axis between the vibrating arm 135A and the vibrating arm 135B shown in FIG. 4A. The vibrating arm 135C and the vibrating arm 135D vibrate in opposite directions in the up-down direction around a central axis r2 extending parallel to the Y-axis between the vibrating arm 135C and the vibrating arm 135D. Thus, mutually opposite twisting moments are generated at the central axes r1, r2, so bending vibrations occur in the vibrating portion 120. At this time, distortion concentrates in regions near the central axes r1, r2 in the base portion 130.

(6. Function of Frequency Adjusting Films)

Next, the function of the frequency adjusting films 236 will be described. In the resonant device 1 according to the present embodiment, after the above-described resonator 10 is formed, a trimming process of adjusting the film thicknesses of the frequency adjusting films 236 is performed.

In the trimming process, first, the resonant frequency of the resonator 10 is measured, and a deviation from an intended frequency is calculated. Subsequently, the film thicknesses of the frequency adjusting films 236 are adjusted based on the calculated frequency deviation. The film thicknesses of the frequency adjusting films 236 can be adjusted by etching the frequency adjusting films 236 through irradiation of, for example, argon (Ar) ion beam to the entire surface of the resonant device 1. When the film thicknesses of the frequency adjusting films 236 are adjusted, it is desirable that fly-off films be removed by cleaning the resonator 10.

In this way, the film thicknesses of the frequency adjusting films 236 are adjusted (i.e., configured) in the trimming process, with the result that variations in frequency can be reduced among a plurality of the resonant devices 1 in the same wafer.

(7. Function of Holes 17)

Figure 5:
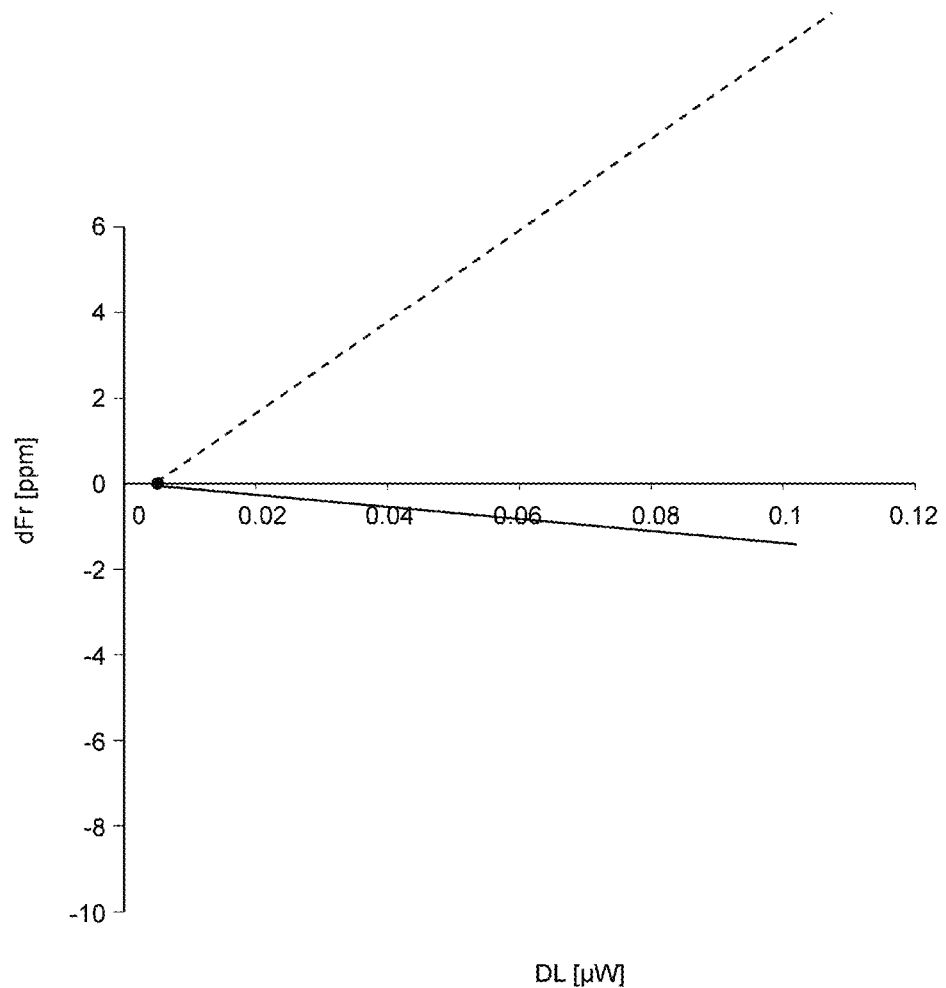
FIG. 5 is a graph that shows the results obtained by verifying the function of recesses.

The function of the holes 17 in the resonator 10 according to the present embodiment will be described with reference to FIG. 5. FIG. 5 is a graph that shows the verified results of DLD for the resonator 10 according to the present embodiment and a resonator 10' in a comparative example with no hole(s) 17. Although the resonator 10' of the comparative example has no hole(s) 17, the remaining configuration is similar to the configuration of the resonator 10. In FIG. 5, the abscissa axis represents drive level, and the ordinate axis represents a rate of change in frequency. In the graph of FIG. 5, the solid line represents the verified result of the resonator 10, and the dashed line represents the verified result of the resonator 10' with no hole(s) 17.

As shown in FIG. 5, as the drive level increases, the frequency of the resonator 10' of the comparative example shifts in a positive direction, whereas the frequency of the resonator 10 according to the present embodiment shifts in a negative direction. It is found from the results of FIG. 5 that DLD improves when the holes 17 are formed.

As described above, the outer vibrating arms 135A, 135D and the inner vibrating arms 135B, 135C vibrate in opposite phases. Therefore, when the resonator 10 vibrates, distortion due to vibrations concentrates on a region between the outer vibrating arm 135A and the inner vibrating arm 135B and a region between the outer vibrating arm 135D and the inner vibrating arm 135C in the base portion 130 (regions near the central axes r1, r2 of FIG. 4A). The resonator 10 according to the present embodiment has the holes 17 in the regions on which the distortion concentrates, so the stiffness of the regions reduces. As a result, concentration of distortion on the regions is relieved, so the influence of holding on attenuation of vibrations reduces. Thus, DLD improves.

Second Exemplary Embodiment

From a second exemplary embodiment, the description of similar matters to those of the first embodiment is omitted, and only the differences will be described. It is noted that similar operation and advantageous effects with similar components will not be repeated one by one for each embodiment.

Figure 6:
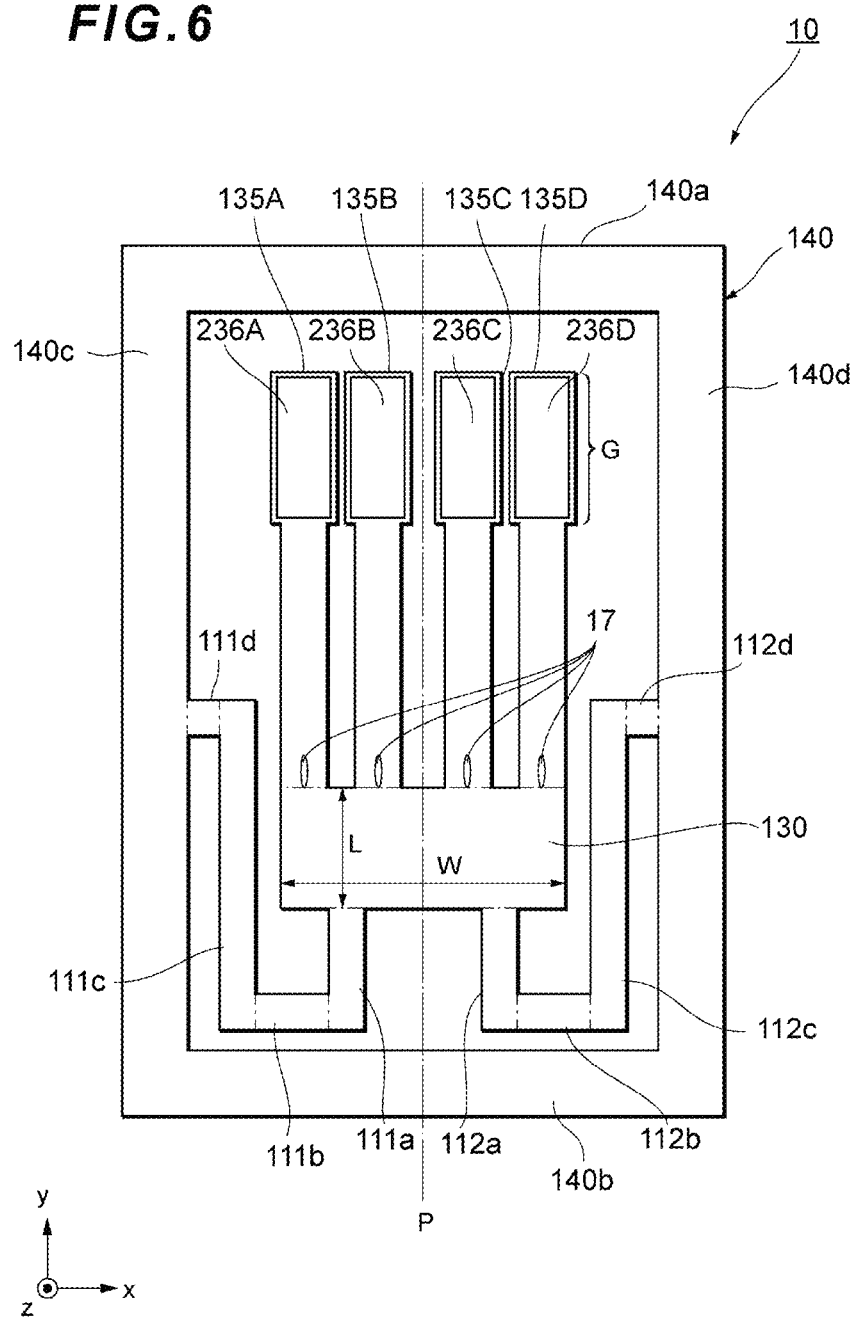
FIG. 6 is a plan view of a resonator according to a second exemplary embodiment of the present invention.

FIG. 6 is a plan view that schematically shows an example of the structure of the resonator 10 according to the present embodiment. Hereinafter, of the detailed components of the resonator 10 according to the present embodiment, differences from the first embodiment will be mainly described. The resonator 10 according to the present embodiment differs from that of the first embodiment in the configuration of the base portion 130 and the positions at which the holes 17 are formed.

(1) Base Portion 130

In the present exemplary embodiment, in the base portion 130, the base portion length L to the base portion width W is adjusted so as to easily deflect in the Z-axis direction. Specifically, the base portion length L is adjusted by etching, or another method, at the time of formation of the base portion 130 such that L/W<0.3. When the base portion length L reduces, the base portion 130 becomes easy to deflect in the Z-axis direction, with the result that DLD is improved (frequency shifts in a negative direction).

In the present embodiment, the holes 17 are formed near the roots (i.e., bases) of the vibrating arms 135A to 135D. Specifically, each hole 17 is formed with a length of approximately 7 µm near the center of the vibrating plate 135 in the width direction from the connection portion of the vibrating arm 135 with the front end 131A toward the free end. The width of each hole 17 is approximately 5 µm. Since each hole 17 is formed at the root of an associated one of the vibrating arms 135, the stiffness of the vibrating arms 135 decreases. Thus, a deflection of the base portion 130 decreases, so DLD deteriorates (frequency shifts in a positive direction).

As in the case of the first embodiment, it is noted that the shapes or positions of the holes 17 are not limited to the example of FIG. 6. For example, the shape of each hole 17 may be polygonal, circular, or elliptical. In addition, each hole 17 is not limited to a through-hole and may be a dent (recess) as described above. The positions at which the holes 17 are formed should be substantially symmetrical positions with respect to the imaginary plane P. Each hole 17 may be formed over a range from the vibrating arm 135 to the base portion 130.

In this way, with the resonator 10 according to the present embodiment, DLD is improved as a result of a reduction in the base portion length L of the base portion 130 by increasing the amount of etching, while DLD deteriorates because of an increase in the size of each hole 17. Eventually, improvement and deterioration of DLD cancel out, so DLD can be improved while variations in DLD due to etching are reduced. The other configuration and functions of the resonator 10 are similar to those of the first embodiment.

An exemplary embodiment of the present invention is described above. A resonator 10 according to one embodiment of the present invention includes a vibrating portion 120 including a plurality of three or more vibrating arms 135 each having a fixed end and a free end, at least two of the vibrating arms 135 being configured to bend out of plane in different phases, and a base portion 130 having a front end 131A connected to the fixed end of each of the plurality of vibrating arms 135 and a rear end 131B opposite from the front end 131A. Moreover, a holding portion 140 is provided at least partially around the vibrating portion 120, a holding arm 111 (112) is provided between the vibrating portion 120 and the holding portion 140, one end of the holding arm 111 (112) is connected to the base portion 130, an other end of the holding arm 111 (112) is connected to the holding portion 140, and a plurality of holes 17 are formed in the vibrating portion 120. The plurality of holes 17 each is formed in a region between any one pair of adjacent two of the plurality of vibrating arms 135 in the base portion 130. With this configuration, the stiffness of the regions on which distortion due to vibrations concentrates in the base portion 130 can be reduced. As a result, concentration of distortion on the regions is relieved, so the influence of holding on attenuation of vibrations reduces. Thus, DLD can be improved.

Preferably, the plurality of holes 17 is formed in a region closer to the front end 131A than to the rear end 131B in the base portion 130. Moreover, the plurality of holes 17 each is preferably formed in a region between any adjacent two of the vibrating arms that vibrate in opposite phases in the base portion 130. Distortion due to vibrations tends to concentrate on the region between any adjacent two of the vibrating arms that vibrate in opposite phases in the base portion 130. Therefore, with this preferable mode, concentration of distortion can be effectively reduced, so DLD can be further improved.

A resonator 10 according to another exemplary embodiment of the present invention includes a vibrating portion 120 including a plurality of three or more vibrating arms 135 each having a fixed end and a free end, at least two of the vibrating arms 135 being configured to bend out of plane in different phases, and a base portion 130 having a front end 131A connected to the fixed end of each of the plurality of vibrating arms 135 and a rear end 131B opposite from the front end 131A. Moreover, a holding portion 140 is provided at least partially around the vibrating portion 120, a holding arm 111 (112) is provided between the vibrating portion 120 and the holding portion 140, one end of the holding arm 111 (112) is connected to the base portion 130, an other end of the holding arm 111 (112) is connected to the holding portion 140, and a plurality of holes 17 are formed in the vibrating portion 120. Preferably, the plurality of holes 17 each is formed in a region closer to the fixed end than to the free end in any one of the plurality of vibrating arms 135. With this configuration, in the resonator 10, DLD is improved as a result of a reduction in the base portion length L of the base portion 130 by increasing the amount of etching, while DLD deteriorates because of an increase in the size of each hole 17. Eventually, improvement and deterioration of DLD cancel out, so DLD can be improved while variations in DLD due to etching are reduced.

Preferably, the plurality of holes 17 each is formed near a center of the any one of the vibrating arms 135 in a direction in which the plurality of vibrating arms 135 is arranged. Preferably, the plurality of holes 17 each has a shape having a longitudinal diameter along a direction in which each of the plurality of vibrating arms 135 extends. According to this preferable mode, when the holes 17 are formed, deterioration of the strength of the vibrating portion 120 can be reduced.

Moreover, the plurality of holes 17 is preferably formed at symmetrical positions with respect to a central axis passing through a center of the vibrating portion 120 in a direction in which the plurality of vibrating arms 135 is arranged. Preferably, each of the plurality of holes 17 is a through-hole or a recess.

In another exemplary aspect, a resonator 10 according to an exemplary embodiment of the present invention includes the above-described resonator 10, and a top lid 30 and a bottom lid 20 provided to face each other with the resonator 10 interposed between the top lid 30 and the bottom lid 20.

In general, it is noted that the exemplary embodiments described above are intended to facilitate an understanding of the present invention and are not intended to limit interpretation of the present invention. Thus, the exemplary embodiments of the present invention can be modified or improved without departing from the purport of the present invention, and the present invention also encompasses equivalents thereof. That is, each of the embodiments with design changes made by persons skilled in the art as needed is also included in the scope of the present invention as long as it includes the characteristics of the present invention. For example, elements of each embodiment, the disposition, materials, conditions, shapes, sizes, and the like, of the elements are not limited to the illustrated ones, and may be changed as needed. For example, in the above-described embodiments, a configuration in which the multilayer body made up of the metal layer E2 and the piezoelectric thin film F3 is a monolayer is described; however, the configuration is not limited thereto. The resonator 10 may be configured such that the multilayer body made up of the metal layer E2 and the piezoelectric thin film F3 is a multilayer and the protective film 235 is formed on the surface of the topmost layer (top lid 30 side). The embodiments are illustrative, and, of course, elements of the different embodiments may be partially replaced or combined. The present invention also encompasses these modes as long as the features of the present invention are included.

REFERENCE SIGNS LIST 1 resonant device
10 resonator
30 top lid
20 bottom lid
140 holding portion
140a to 140d frame element
111, 112 holding arm
120 vibrating portion
130 base portion
135A to 135D vibrating arm
F2 Si substrate
F21 silicon oxide layer (temperature characteristics correction layer)
235 protective film
236 frequency adjusting film
17 hole

The invention claimed is:

1. A resonator comprising:
   a vibrating portion including at least three vibrating arms each having a fixed end and a free end, with at least two of the vibrating arms configured to bend out of plane in different phases, and a base having a front end coupled to the fixed end of each vibrating arm and a rear end opposite from the front end;
   a frame disposed at least partially around the vibrating portion;
   at least one holding arm disposed between the vibrating portion and the frame and including a first end connected to the base and a second end connected to the frame; and
   a plurality of holes disposed in the base of the vibrating portion,
   wherein the plurality of holes disposed in the base are all of the holes disposed in the base of the vibrating portion and are all disposed in respective regions between a respective pair of adjacent vibrating arms in the base,
   wherein each of the holes disposed in the base of the vibrating portion comprises a width extending in a direction orthogonal to a lengthwise direction in which the at least three vibrating arms extend does not overlap any of the at least three vibrating arms in the lengthwise direction.

2. The resonator according to claim 1, wherein the plurality of holes is disposed in a region closer to the front end of the base than the rear end of the base.

3. The resonator according to claim 2, wherein the plurality of holes each is disposed in a region between the adjacent vibrating arms that are configured to vibrate in opposite phases from each other in the base.

4. The resonator according to claim 2, wherein the plurality of holes are each disposed in the base and between extending lines of the respective pair of adjacent vibrating arms.

5. The resonator according to claim 1, wherein the plurality of holes are through holes extending through the base of the vibrating portion in a thickness direction thereof.

6. The resonator according to claim 5, wherein each through hole comprises one of a polygonal shape, a circular shape or an elliptical shape.

7. The resonator according to claim 1, wherein the plurality of holes are each recesses that do not extend entirely through the base of the vibrating portion in a thickness direction thereof.

8. The resonator according to claim 1, wherein the plurality of holes are disposed at symmetrical positions with respect to a central axis passing through a center of the vibrating portion in a direction in which the at least three vibrating arms extend.

9. The resonator according to claim 1, wherein the plurality of holes each has a shape having a longitudinal diameter along a direction in which each of the at least three vibrating arms extend.

10. A resonant device comprising:
    the resonator according to claim 1;
    a top lid and a bottom lid that face each other with the resonator interposed between the top lid and the bottom lid and sealed in a space defined therebetween; and
    an outer electrode.

11. A resonator comprising:
    a vibrating portion including at least three vibrating arms each having a fixed end and a free end, with at least two of the vibrating arms configured to bend out of plane in different phases, and a base having a front end coupled to the fixed end of each vibrating arm and a rear end opposite from the front end;
    a frame disposed at least partially around the vibrating portion;
    at least one holding arm disposed between the vibrating portion and the frame and including a first end connected to the base and a second end connected to the frame; and
    a plurality of holes disposed in the vibrating portion and each disposed in a region between a respective pair of adjacent vibrating arms in the base,
    wherein the plurality of holes are through holes extending through the base of the vibrating portion in a thickness direction thereof, and
    wherein each through hole comprises a circular arc-shaped opening.

12. The resonator according to claim 11, wherein each circular arc-shaped opening has a width of 5 μm and length of 18 μm.

* * * * *